United States Patent [19]

Rood

[11] Patent Number: 4,897,044

[45] Date of Patent: Jan. 30, 1990

[54] BATTERY JUMPER CABLE

[75] Inventor: Michael J. Rood, Hoffman Estates, Ill.

[73] Assignee: Pi-Chen Hsu Chou, Taipei, Taiwan

[21] Appl. No.: 75,127

[22] Filed: Jul. 20, 1987

[51] Int. Cl.⁴ .......................................... H01R 11/00
[52] U.S. Cl. ..................................... 439/504; 320/48; 320/25; 324/133
[58] Field of Search ............................. 439/502–505; 320/25, 26, 48; 324/133

[56] References Cited

U.S. PATENT DOCUMENTS

| | | | |
|---|---|---|---|
| 3,267,452 | 8/1966 | Wolf | 439/504 |
| 3,936,121 | 2/1976 | Leinberger | 320/25 |
| 4,145,648 | 3/1979 | Zender | 439/504 |
| 4,420,212 | 12/1983 | Wright | 439/504 |
| 4,488,147 | 12/1984 | Signorile | 439/504 |
| 4,840,583 | 6/1989 | Moore | 320/25 |

Primary Examiner—P. Austin Bradley
Attorney, Agent, or Firm—Lockwood, Alex, Fitzgibbon & Cummings

[57] ABSTRACT

A battery jumper cable unit wherein the negative terminal clamps each carries a test probe circuit comprising a bar-ended test probe mounted in insulated relationship on the negative terminal clamp and electrically connected by an insulated test wire to the cable interconnecting the positive terminal clamps. A diode, resistor and lamp (or other attention-getting means) are interconnected in series in said insulated test wire and mounted on the negative terminal clamp. Additional attention-getting devices (different colored lamps, bells, speakers) may be incorporated if desired.

5 Claims, 2 Drawing Sheets

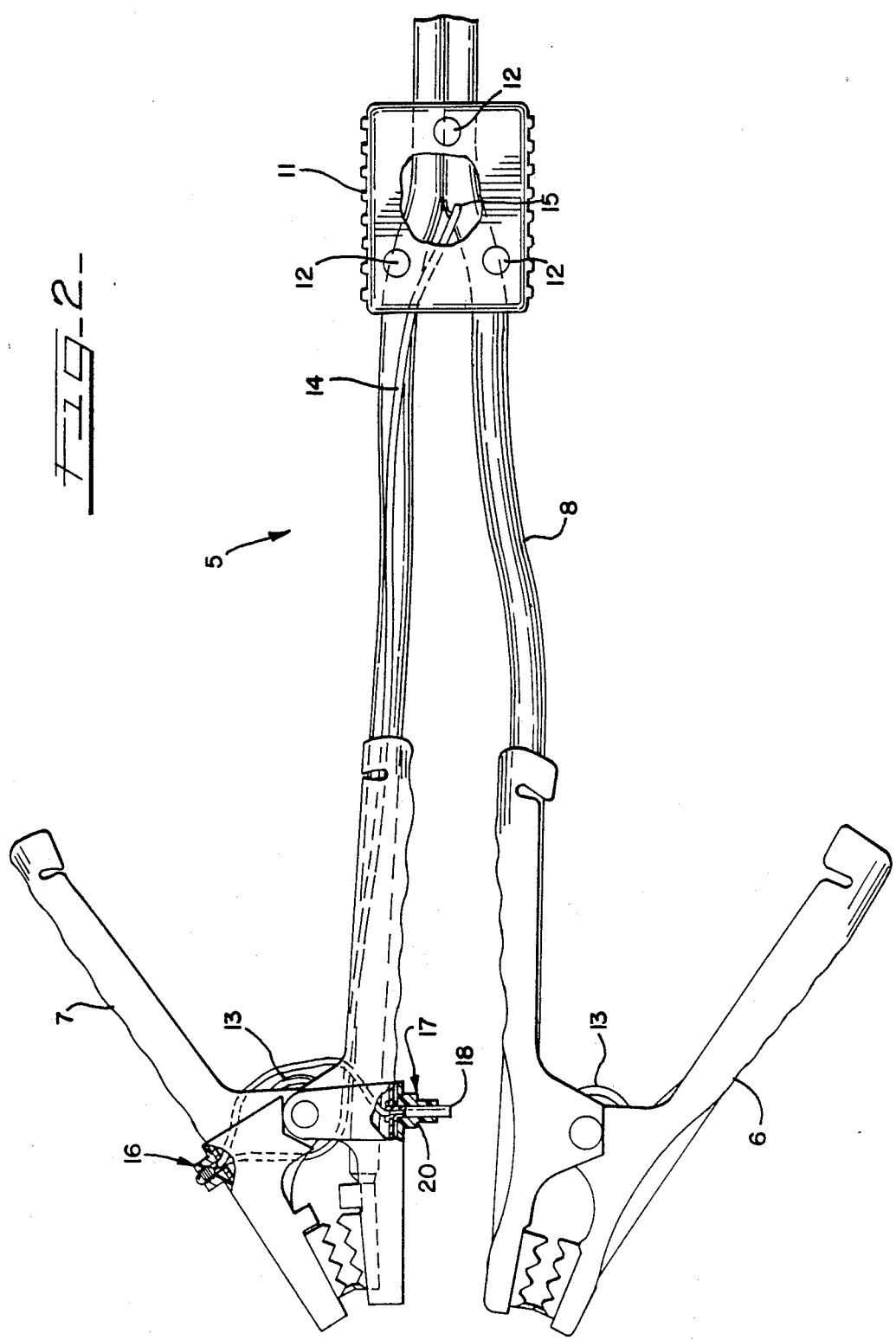

BATTERY JUMPER CABLE

The present invention relates, generally, to innovations and improvements in battery jumper cables which enhance the safety with which unskilled persons can employ the cables when the occasion arises.

The danger of explosion ad consequent injury to the user of conventional battery jumper cables is known and various proposals have been made to incorporate safety features so as to avoid accidents and injuries. Such proposals are reflected in the following patents: Greenburg 3,466,453; FIMA 3,942,027; Bradenburg 4,079,304; Colbrese 4,157,492; Zapf 4,272,142; and Signorile 4,488,147.

The object of the present invention, generally stated, is the provision of battery jumper cables incorporating safety features which permit inexperienced or unskilled persons to employ the jumper cables in a safe manner and which cables are further characterized in being reliable, and economical to produce on a mass production basis.

Certain other and more specific objects of the invention will become apparent from the following detailed description of preferred embodiments of the invention taken in connection with the accompanying drawings wherein:

FIG. 2 is a plan view on enlarged scale showing one end of the battery jumper cable unit shown in FIG. 1;

Figure 1:
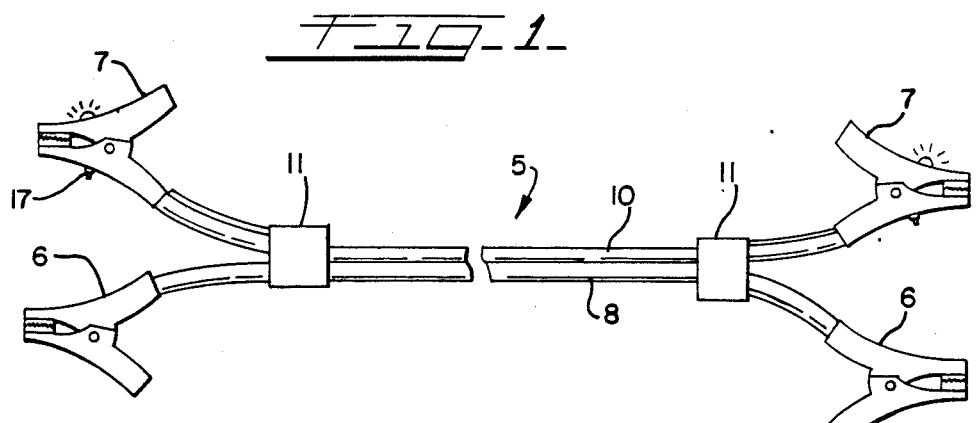
FIG. 1 is a plan view of a battery jumper cable unit representing the simplest form of the present invention.

In FIG. 1 a battery jumper cable unit is indicated generally at 5 which is symmetrical on opposite ends each of which has a positive clamp 6 and a negative clamp 7. The positive clamps 6 are electrically interconnected by a conventional insulated positive cable 8 and the negative clamps 7—7 are electrically interconnected by an insulated negative cable 10. Adjacent each opposite end of the unit 10 the cables 8 and 10 are joined or clamped together by clamps 11—11 which may be formed from mating plastic halves joined together by screws 12—12 (FIG. 2) or other suitable means. By having the cables 8 and 10 joined together adjacent their opposite ends but with a sufficient clearance or distance back from the clamps 6 and 7, the risk of using a clamp at one end and a second clamp at the opposite end is minimized.

Except as noted below, the construction of the connector cables 8 and 10 and the clamps 6—6 and 7—7 follow conventional designs well known in the art with the terminal clamps 6 and 7 being normally strongly forced or biased toward their closed position by the usual coil springs 13—13 (FIG. 2).

Figure 3:
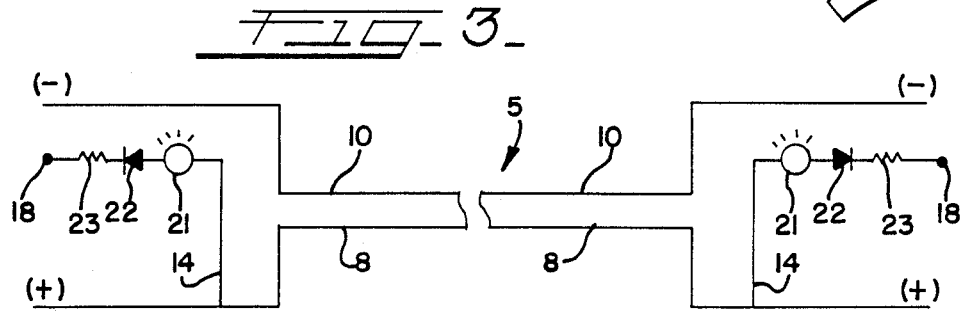
FIG. 3 is a circuit diagram of the battery jumper cable unit shown in FIGS. 1 and 2.

The way in which the battery jumper cable unit 5 differs from conventional through the provision of the present invention can be readily understood with reference to FIGS. 2 and 3. An insulated test wire 14 is joined by soldering or otherwise to the conductor within the positive cable 8 with the test wire 14 penetrating the insulation covering of the cable 8 as indicated at 15. The test wire 14 extends to one handle of the adjacent negative clamp 7 and passes through the handle so as to be connected with one terminal of a combination indicator lamp, diode and resistor unit indicated generally at 16 mounted in insulated relationship on the terminal clamp 7 as indicated. The test wire 14 continues from the unit 16 to a test probe indicated generally at 17. The test probe 17 has a central metal prong 18, the tip of which is bare and exposed. The prong 18 is supported and housed in an insulator body 20 suitably mounted on the adjacent portion of the clamp 7. Referring to FIG. 3, the lamp, diode and resistor forming the unit 16 are designated at 21, 22, and 23, respectively.

The manner in which the invention as incorporated and embodied in the battery jumper cable unit 5 operates or functions, can be readily understood by describing in connection with FIGS. 1—3, the proper way in which the unit 5 is to be used to "jump start" a vehicle with a weak or dead battery from a another vehicle with a charged battery. In conformity with conventional practice, the positive clamps 6—6 will be colored red while the negative clamps 7 will be colored black. The colorations can be applied either directly to the clamps themselves or to plastic sleeves that provide insulation as well as a means of color coding. The user first shuts off the motor on the vehicle with the good battery if the motor is running and then takes the red positive clamp 6 at one end of the unit 5 and clamps it to what is believed to be positive terminal or post of the live battery. The posts of a battery are usually marked positive and negative, respectively, and often the positive post or terminal is appreciably larger than the negative terminal or post. Having placed the positive clamp 6 on what the user believes to be the positive terminal of the live battery, the user then touches the bare end 18 of the probe 17 of the negative clamp to a heavy gauge metal part of the frame, to the engine block, to the alternator bracket, etc. of the vehicle with the live battery. If the the positive clamp 6 has been correctly clamped to the positive terminal of the live battery, the lamp 21 will glow when the probe 17 is touched to the metal ground as will be readily appreciated from FIG. 3 with the elements 21, 22 and 23 being interconnected with the probe 18 in series circuit relationship. On the other hand, if the positive clamp 6 has been inadvertently clamped onto the negative terminal of the live battery it will be seen that the lamp 21 will not glow when the probe 17 is touched to a engine block or other heavy metal part of the vehicle with the live battery. If the user has applied the positive clamp 6 to the positive terminal or post of the battery in the first instance it is left in that clamped condition and the negative clamp 7 is clamped onto a convenient metal part of the vehicle. On the other hand, if the positive clamp 6 has been inadvertently first applied to the negative terminal or post of the live battery, the lamp 21 will fail to glow, whereupon the user removes the clamp 6 and applies it to the remaining or other terminal of the live battery. The probe 17 of the negative clamp 7 is touched to a heavy metal part of the vehicle whereupon the lamp 21 should glow. The negative clamp is then applied to a metal part of the vehicle.

Having properly made the connection of the cable unit at one end to the live battery and a ground location, the user then repeats the above procedure in connecting the opposite end of the battery jumper cable unit 5 to the weak or dead battery in the other vehicle and a heavy metal part thereof. The user now starts the motor of the vehicle with the live battery and thereafter the motor on the vehicle with the weak or dead battery is started.

Having started the motor of the vehicle with the weak battery, the user then removes the clamps in the reverse order in which the connections were made, taking care not to allow the cable clamps to touch one another during removal.

Figure 4:
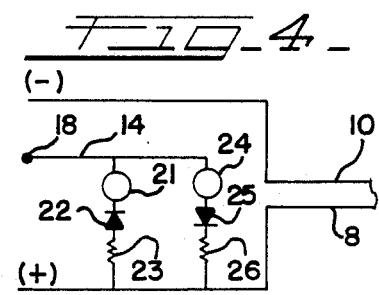
FIGS. 4, 5 and 6 are circuit diagrams showing embodiments of the invention in which additional attention-getting features have been incorporated.
Figure 5:
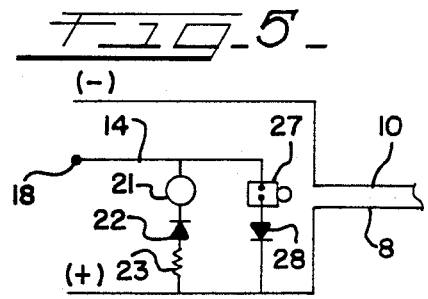
Figure 6:
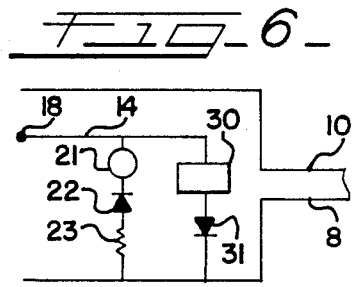

The modifications of the invention represented in FIGS. 4-6 embody the same basic test circuit as the embodiment diagrammatically shown in FIG. 3 and include additional features that may be considered desirable by certain users. The portions of the electrical circuits shown in FIGS. 3 that are retained in FIGS. 4, 5 and 6 are designated by the same reference numerals. Referring to FIG. 4 the modified test circuit includes a lamp 24, a diode 25 and resistor 26 interconnected in series with each other and in series in test circuit line 14, and in parallel with the lamp 21, diode 22 and resistor 23. The lamp 21 will be one color (e.g. green) while the lamp 24 will be of a different color (e.g. red). The diode 25 is connected with reverse polarity from the diode 22.

In the embodiment diagrammatically shown in FIG. 5 a bell or buzzer 27 and a diode 28 are connected in parallel with the lamp 21, diode 22 and resistor 23. In the embodiment shown in FIG. 6 a speech device 30 and a diode 31 are interconnected in parallel circuit relationship with the lamp 21, diode 22 and resistor 23. With respect to the embodiments shown in FIGS. 5 and 6 will be desirable to house the bell or buzzer 27 or the speaker device 30 within the cable joining cases 11—11.

When the embodiments of FIGS. 4, 5 and 6 are used, if the green lamp 21 fails to glow when the bare end or tip 18 of the probe is touched to a metal part, then the red lamp 24 (FIG. 4) will glow instead, or the bell 27 (FIG. 5) will ring, or the device 30 (FIG. 6) will sound.

What is claimed:

1. A battery jumper cable unit with integrated safety features for use in starting a first vehicle having a first battery requiring assistance from a second battery in a second vehicle providing assistance, comprising, in combination:

positive and negative insulated electrical cables long enough to reach between said first and second batteries and physically joined adjacent their opposite ends by clamping means;

a pair of positive terminal clamps attached in electrically conducting relationship to opposite ends of said positive insulated electrical cable for clamping onto the positive terminals of said first and second batteries;

a pair of negative terminal clamps attached in electrically conductive relationship to opposite ends of said negative insulated electrical calbe one of which is for clamping onto the engine block or other ground point on said second vehicle and the other of which is for clamping onto the engine block or other ground point on said first vehicle; and an installer's warning circuit comprising, a test probe mounted in electrically insulated relationship on each said negative terminal clamp, an insulated test conductor electrically interconnecting each said test probe with said positive insulated electrical cable, and an electrically actuated attention-getting means, a diode and a resistor mounted in electrically insulated relationship on each said negative terminal clamp and interconnected in series circuit relationship with each other and with the said test probe mounted on the same one of said negative terminal clamps by means of the same one of said insulated test conductors, each of said negative terminal clamps comprising two jaws with one of said test probes mounted on one of said jaws and one of said attention-getting means mounted on the other of said jaws and with said one test probe and said one attention-getting means being exposed in opposite directions, whereby said attention-getting means is exposed to view when said test probe is hidden from view and each of said insulated test conductors being connected with said positive insulated electrical cable within the adjacent of said clamping means.

2. In the battery jumper cable unit called for in claim 1, said electrically actuated attention-getting means being a lamp.

3. In the battery jumper cable unit called for in claim 1, wherein a second attention-getting means, a second diode, and a second resistor are mounted in electrically insulated relationship on each said negative terminal clamp and interconnected in series circuit relationship and with said test prong mounted on the same one of said negative terminal clamps and in parallel circuit relationship with said first mentioned electrically actuated attention-getting means, diode and resistor, said first mentioned diode and said second diode being connected in their respective circuits with reverse polarities.

4. In the battery jumper cable unit of claim 3, said first-mentioned attention-getting means being a lamp and said second attention-getting means being a lamp which glows with a color different from that of said first attention-getting lamp.

5. In the battery jumper cable unit of claim 3, said second attention-getting means being an electrically actuated noise maker.

* * * * *